United States Patent [19]

Hatanaka et al.

[11] Patent Number: 4,461,956
[45] Date of Patent: Jul. 24, 1984

[54] SOLID-STATE PHOTOELECTRIC CONVERTER

[75] Inventors: Katsunori Hatanaka, Yokohama; Yutaka Hirai, Tokyo; Naoki Ayata, Machida; Shunichi Uzawa, Tokyo, all of Japan

[73] Assignee: Canon Kabushiki Kaisha, Tokyo, Japan

[21] Appl. No.: 558,573

[22] Filed: Dec. 6, 1983

Related U.S. Application Data

[63] Continuation of Ser. No. 247,763, Mar. 26, 1981, abandoned.

[30] Foreign Application Priority Data

Mar. 31, 1980 [JP] Japan .................................. 55-42211
Mar. 31, 1980 [JP] Japan .................................. 55-42212
Mar. 31, 1980 [JP] Japan .................................. 55-42213
Mar. 31, 1980 [JP] Japan .................................. 55-42214

[51] Int. Cl.$^3$ ............................................ H01J 40/14
[52] U.S. Cl. ...................................... 250/578; 357/32
[58] Field of Search ........................... 250/211 J, 578; 358/212, 213; 357/31, 32

[56] References Cited

U.S. PATENT DOCUMENTS 3,715,485 2/1973 Weimer ................................ 178/7.1
3,824,337 7/1974 Sangster et al. ..................... 178/7.1
3,967,055 6/1976 Teer et al. ............................ 178/7.1
4,274,113 6/1981 Ohba et al. ........................... 358/212
4,369,372 1/1983 Yoshioka et al. .................... 250/578
4,419,696 12/1983 Hamano et al. ...................... 250/578

Primary Examiner—David C. Nelms
Assistant Examiner—J. Brophy
Attorney, Agent, or Firm—Fitzpatrick, Cella, Harper & Scinto

[57] ABSTRACT

A photoelectric converter in solid-state assembly, comprising the following sections formed on the same substrate: a photoelectric converting section constituted of a number of photoelectric converting elements arranged in an array, each element having a light-receiving surface for input of light-information; and a signal processing circuit section comprising a number of accumulating means, each provided for each of said photoelectric converting elements, for accumulation of signals produced as output from the corresponding photoelectric converting elements, a number of transfer means for transferring the signals accumulated in the corresponding accumulating means to other places, and an array of a number of transistors wired in a two-dimensional matrix to drive a number of the transfer means in time series, said photoelectric converting elements, and the transfer means and the transistors constituting said signal processing circuit section being constituted of thin semi-conductor films.

22 Claims, 22 Drawing Figures

SOLID-STATE PHOTOELECTRIC CONVERTER

This application is a continuation of application Ser. No. 247,763 filed Mar. 26, 1981, now abandoned.

BACKGROUND OF THE INVENTION

1. Field of the Invention

This invention relates to a photoelectric converter, particularly to a solid-state photoelectric converter which can be applied for a light-information input section such as of facsimile digital copier, laser recorder, etc. or for parcord reading means or other means for reading letters, images, etc.

2. Description of the Prior Arts

There have recently made remarkable developments of so called solid-state photoelectric converters to be applied for light-information input sections such as of facsimile, digital copier, laser recorder, etc., or for means for reading letters or images written on manuscripts. Such photoelectric converters, for the purpose of miniaturization of the assembly as a whole, tend to have so called elongated light-receiving surfaces of the sizes equal to or approximate to those of the original images reproduced with excellent resolution, being capable of reading faithfully original images and yet compact.

The photoelectric converters as mentioned above having elongated light-receiving surfaces involve a great problem with respect to the signal processing circuit section to be equipped along with the photoelectric converting section.

More specifically, the aforesaid signal processing circuit section will occupy an areal space by far greater than the photoelectric converting section, whereby it is not possible to enjoy fully the advantage of the miniaturization effected by extremely shortened optical path length of light-information signal received as input to the light-receiving surface, which has been accomplished by elongation of the photoelectric converting section.

To speak of one method conventionally used for resolving this problem, there is generally adopted a system wherein the group of photoelectric converting elements (image elements) in the photoelectric converting section are divided into a plurality of blocks, each being wired in a matrix to provide the signal processing circuit section common to each block, which signal processing circuit section can thus be actuated by these block elements.

The problem to be encountered in the matrix wiring as mentioned above is that the bonding steps necessary for taking out the signals through connection between each photoelectric element and the signal processing section are extremely increased unless the group of photoelectric converting elements is integrated with the signal processing section.

In order to overcome this problem, such an integration is generally attempted by providing the signal processing circuit section on a crystalline silicon substrate and forming the photoelectric converting section thereon.

However, since the light-receiving surface of the photoelectric converting section is elongated, it is required to provide the signal processing section adjacent to the photoelectric converting section. With such a requirement, use of a crystalline silicon substrate is not in good compliance.

SUMMARY OF THE INVENTION

An object of the present invention is to improve the photoelectric converter of prior art.

Another object of the present invention is to provide a solid-state assembled photoelectric converter having an elongated light-receiving surface, in which there is no deficient element present in a number of photoelectric converting elements constituting the photoelectric converting section.

According to an aspect of the present invention, there is provided a solid-state assembled photoelectric converter, comprising the following sections formed on the same substrate:

a photoelectric converting section constituted of a number of photoelectric converting elements arranged in an array, each element having a light-receiving surface for input of light-information; and a signal processing circuit section comprising a number of accumulating means, each provided for each of said photoelectric converting elements, for accumulation of signals produced as output from the corresponding photoelectric converting elements, a number of transfer means for transferring the signals accumulated in the corresponding accumulating means to other places, and an array of a number of transistors wired in a two-dimensional matrix to drive a number of the transfer means in time series, said photoelectric converting elements, and the transfer means and the transistors constituting said signal processing circuit section being constituted of thin semiconductor films.

According to another aspect of the present invention, there is provided a photoelectric converter in solid-state assembly, comprising the following sections formed on the same substrate:

a photoelectric converting section constituted of a number of photoelectric converting elements arranged in an array, each element having a light-receiving surface for input of light-information; and a signal processing circuit section comprising a number of accumulating means, each provided for each of said photoelectric converting elements, for accumulation of signals produced as output from the corresponding photoelectric converting elements, a diode for prevention of crosstalk at each interval between the photoelectric converting elements, and a number of transfer means for transferring the signals accumulated in the corresponding accumulating means to other places, said photoelectric converting elements, said diode and said transfer means being constituted of thin semiconductor films.

According to a further aspect of the present invention, there is provided a photoelectric converter in solid-state assembly, comprising the following sections formed on the same substrate:

a photoelectric converting section constituted of a number of photoelectric converting elements arranged in an array, each element having a light-receiving surface for input of light-information; and a signal processing circuit section comprising a number of diodes, each being provided for each of said photoelectric converting elements directly connected thereto, for prevention of crosstalk at each interval between the photoelectric converting elements and a number of transistors, each being provided for each diode directly connected thereto, for transferring the output signals from the corresponding photoelectric converting elements, said photoelectric converting elements, said diodes and said transistors being constituted of thin semiconductor films.

According to a still further aspect of the present invention, there is provided a photoelectric converter in solid-state assembly, comprising the following sections formed on the same substrate:

a photoelectric converting section constituted of a number of photoelectric converting elements arranged in an array, each element having a light-receiving surface for input of light-information; and a signal processing circuit section comprising a number of accumulating means, each provided for each of said photoelectric converting elements, for accumulation of signals produced as output from the corresponding photoelectric converting elements, a number of transfer means for transferring the signals accumulated in the corresponding accumulating means to other places, and a shift register to drive a number of transfer means in time series, said photoelectric converting elements, and the transfer means and the shift register constituting said signal processing circuit section being constituted of thin semi-conductor films.

DESCRIPTION OF THE PREFERRED EMBODIMENT

Figure 1:
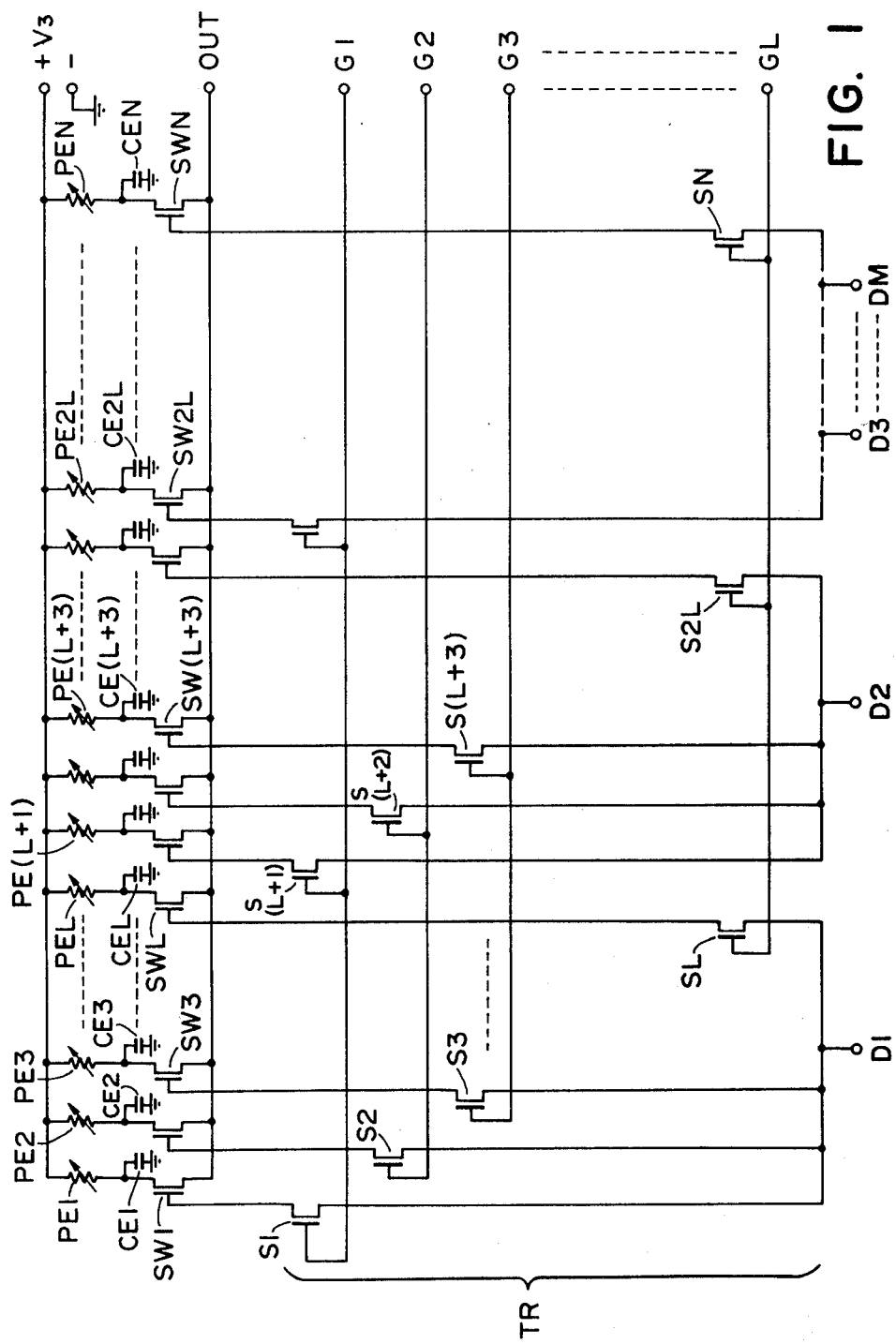
FIG. 1 is a diagram of an equivalent circuit used in a photoelectric converter which is the first embodiment of this invention.

FIG. 1 shows an equivalent circuit used in a photoelectric converter which is the first embodiment of this invention. The photoelectric converter comprises a photoelectric converting section constituted of photoelectric converting elements of N in number (PE1, PE2, ... PEN) which are arranged in an array, and a signal processing circuit section constituted of accumulating capacitors of N in number (CE1, CE2, ... CEN) which are respectively connected with the corresponding photoelectric converting elements for accumulating signals from the photoelectric converting elements, each of the signals being proportional to the quantity of charge in each of the photoelectric converting elements, transfer transistors of N in number (SW1, SW2, ... SWN) for transferring the charges accumulated in said capacitors to an output terminal OUT in a sequential manner, and a transistor array TR including transistors of N in number (S1, S2, ... SN) for successively driving the transfer transistors in time series. The transistors (S1, S2, ... SN) constituting the transistor array TR are grouped into each group of transistors of L in number to form blocks of M in number. The transistors in each block are connected to the transistors in equiphase in the other blocks to define a so-called two-dimensional matrix wiring.

Each of the photoelectric converting elements PE includes an individual image-element electrode between the photoelectric converting elements PE which are connected with a common electrode connected with a source of power $V_3$ (+1 to +10 V) for the photoelectric converting section.

The image-element electrodes of N in number are respectively connected with the corresponding accumulating capacitors CE the opposite poles of which are earthed. Furthermore, the image-element electrodes are respectively connected with the drain electrodes of the corresponding transfer transistors SW each of which includes a source electrode connected with the output terminal OUT. Each of the transfer transistors SW also includes a gate electrode connected with the drain electrode of the corresponding one of the transistors (S1, S2, ... SN) constituting the transistor array TR. The gate electrodes of the transistors (S1, S2, ... SN) are wired in a matrix through signal lines of L in number (G1, G2, ... GL) while the source electrodes of the same transistors are wired in a matrix through signal lines of M in number (D1, D2, ... DM). The signal lines to the source electrodes will now be referred to "block-selecting signal lines" while the signal lines to the gate electrodes be referred to "gate-selecting signal lines".

Light information which is incident upon the light-receiving surface of each photoelectric converting element PE modulates the resistance in that photoelectric converting element to change the current (quantity of charge) flowing from the power source V for the photoelectric converting section into the corresponding accumulating capacitor CE. On the other hand, the charges accumulated in the accumulating capacitors are in sequence discharged therefrom through the output terminal OUT by switching to place the transfer transistors into a conductive state one at a time. In other words, the incident light-information is fetched from the output terminal OUT in time series as charges accumulated in the capacitors from one conductive state to another conductive state of the transfer transistors SW.

The transfer transistors (SW1, SW2, ... SWN) are driven by the transistor array TR constituted of the matrix-wired transistors (S1, S2, ... SN). Namely, only a desired transfer transistor is selectively placed on its conductive state through the group of gate selecting signal lines (G1, G2, ... GL) of the transistors (S1, S2, ... SN) and the group of block selecting signal lines (D1, D2, ... DM). Now, it is to be noted that M by L is N.

Figure 2:
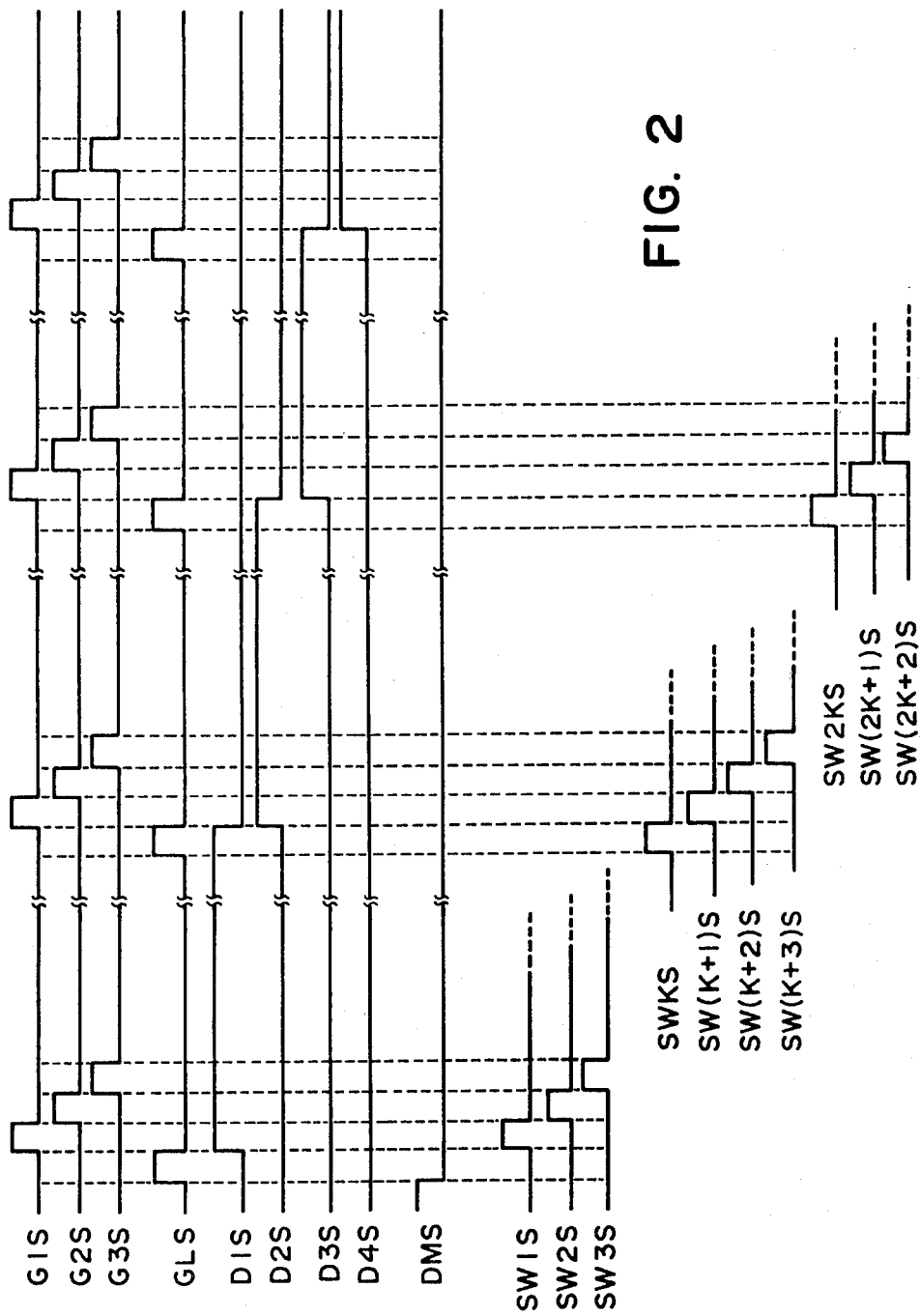
FIG. 2 is a timing chart for illustrating the operation of the photoelectric converter in FIG. 1.

FIG. 2 shows a timing chart for illustrating the drive of the transfer transistors (SW1, SW2, ... SWN). Generally, driving frequency in gate selecting signals (G1S, G2S, ... GLS) is L times as large as that in block selecting signals (D1S, D2S, ... DMS). All of the block selecting signals (D1S, D2S, ... DMS) are successively driven to fetch the outputs from the photoelectric converting elements of N=L×M in number through the terminal OUT by means of the transfer transistors SW.

In this photoelectric converting apparatus, the photoelectric converting elements PE, transfer transistors SW and transistors S are formed of semiconductor film. These components are all formed integrally on the same substrate together with the accumulating capacitors CE and matrix wirings.

The photoelectric converting element PE is constituted of a photoreceptor layer for giving changes in electrical properties by photo-irradiation provided between an image element electrode and a common electrode which is commonly used for each photoelectric converting element.

In the present invention, the photoreceptor layer constituting the photoelectric converting element PE may be composed of a highly sensitive photoconductive material capable of being formed into a thin film, such as of amorphous hydrogenated silicon (hereinafter referred to as a-Si:H), PbO, CdSe, $Sb_2O_3$, Se, Se-Te, Se-Te-As, Se-Bi, ZnCdTe, CdS, $Cu_2S$, amorphous hydrogenated germanium (hereinafter referred to as a-Ge:H), amorphous hydrogenated germanium silicon (hereinafter referred to as a-$Ge_xSi_{(1-x)}$:H).

The semiconductor film constituting the transistor SW and the transistor S may be constituted of, for example, CdSe, a-Si:H, a-Ge:H, a-$Ge_xSi_{(1-x)}$, polycrystalline silicon, etc.

In the present invention, the photoreceptor layer may preferably be constituted of a-Si:H, while the film transistors SW and S of a-Si:H or polycrystalline silicon, in view of the advantage that it can be made either n-type or p-type by doping as impurity of an element of the group V-A in the periodic Table such as N, P, As, Sb, Bi, etc. or an element of the group III-A in the periodic Table such as B, Al, Ga, In, Tl, etc.

In the present invention, the layer thickness of the photoreceptor layer is determined depending on the degree of absorption of photo-carriers generated by incidence of light-information thereon, but it is generally 4000 Å to 2 μm, preferably 6000 Å to 1.5 μm. On the other hand, the layer thickness of the semiconductor layer for the film transistor SW or S may desirably be thinner than the thickness of the void layer region formed by application of the voltage on the gate electrode provided through an intermediary insulating layer, being generally within the range from 1000 Å to 1 μm.

As the substrate, on which the photoelectric converting section and the signal processing circuit section are formed, there may be adopted a transparent material, for example, when light-information enters the light-receiving surface of the photoelectric converting section from the side of the substrate. But there is no such limitation of the substrate, when light-information enters from the light-receiving surface formed on the opposite side of the substrate.

The materials to be suitably used for the substrate in the present invention may include a number of commercially available ones, so long as they are excellent in flatness, surface smoothness, heat resistance as well as resistance to chemicals during preparation. Typical examples of such substrate forming materials are glass, glass No. 7059 (produced by Dow Corning, Co.), magnesia, beryllia, spinel, yttrium oxide or other transparent materials, aluminum, molybdenum, special stainless steel (Sus according to Japanese Industrial Standard), tantalum or other non-transparent metallic materials.

Figure 3:
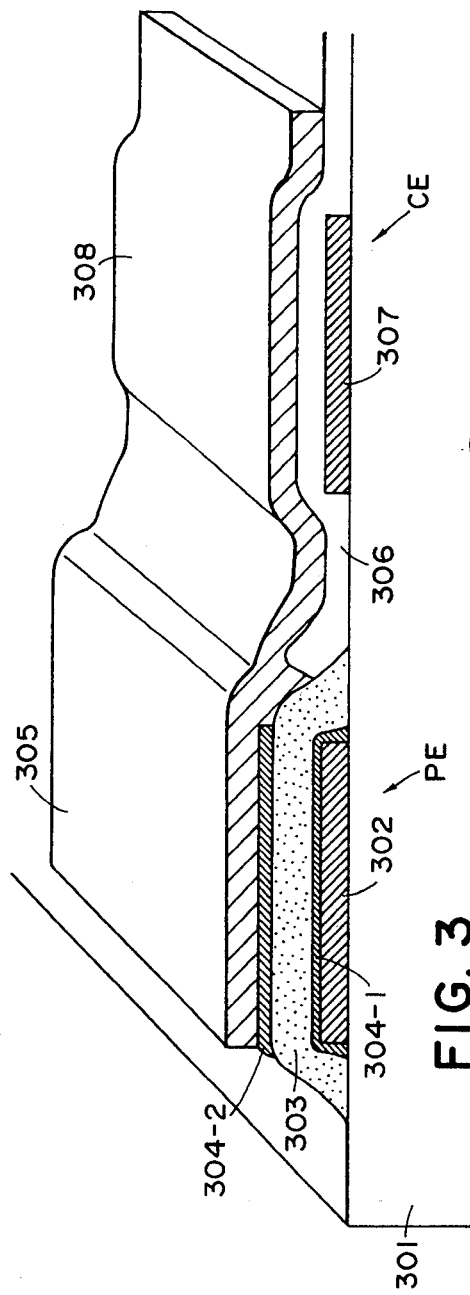
FIG. 3 is a perspective view schematically showing the structure of a photoelectric converting element in the first embodiment.

FIG. 3 shows a schematic slant view for illustration of the structure of the photoelectric converting element PE. In this embodiment, there is employed a glass as substrate and the light-receiving surface is opposite to the side on which the photoelectric converting element is provided. With such a structure, a transparent material is employed for the light-receiving electrode 302 (common electrode) on the substrate side for connection of the photoreceptor layer 303 commonly to each of the photoelectric converting elements PE.

A photoreceptor layer 303 is formed of a-SiH of non-dope, n or i type. In order to form ohmic contact layers on the opposite sides of the photoreceptor layer 303, a-Si:H layers 304-1 and 304-2 subjected to doping into n+ type are formed respectively on the electrode 302 and the image-element electrode 305. The a-Si:H layers will be referred to as n+ layers hereinafter.

The image-element electrode 305 is made of such a material as aluminum or the like and connected with the accumulating capacitor CE and the transfer transistor SW. The accumulating capacitor CE includes an insulating layer 306 and electrodes 307, 308 between which the insulating layer 306 is interposed. The insulating layer 306 is made of, for example, $Si_3N_4$ by glow discharging, $SiO_2$ by sputtering or $SiO_2$ by chemical vapour deposition (CVD). The photoreceptor layer 303 and n+ layers 304-1, 304-2 are preferably formed of $Si_3N_4$ by glow discharging.

Figure 4:
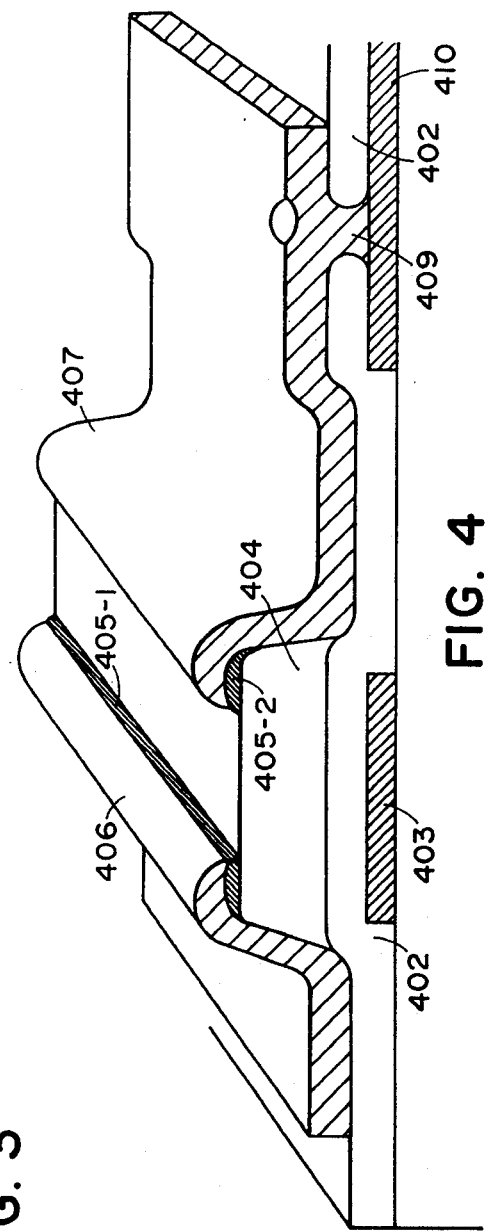
FIG. 4 is a perspective view schematically showing the structure of a film-like transistor in the first embodiment.

FIG. 4 illustrates the structure of the film transistor SW or S used in this invention. This structure comprises a semiconductor film layer 404 made of a-Si:H of non-dope, n or i type or polycrystalline silicon of i type, a gate electrode 403, an insulating layer 402 between the semiconductor layer and the gate electrode, n+ layers 405-1 and 405-2 formed on the semiconductor layer 404, a source electrode 406 on one of the n+ layers, and a drain electrode 407 on the other n+ layer 405-2.

The insulating layer 402 can be made of $Si_3N_4$ by glow discharging, $SiO_2$ by sputtering or $SiO_2$ by CVD. In this invention, the insulating layer is preferably formed of $Si_3N_4$ by glow discharging. The source and drain electrodes 406 and 407 are preferably made of such a material as aluminum or the like.

The wiring between the film transistors and the electrical connection between the film transistors and photoelectric converting elements are effected by a wiring pattern including two layers 410 and 407 which are electrically separated from each other by the insulating layer 402. These doubled layers are connected with each other through a hole 409 formed in the insulating layer 402.

Figure 5:
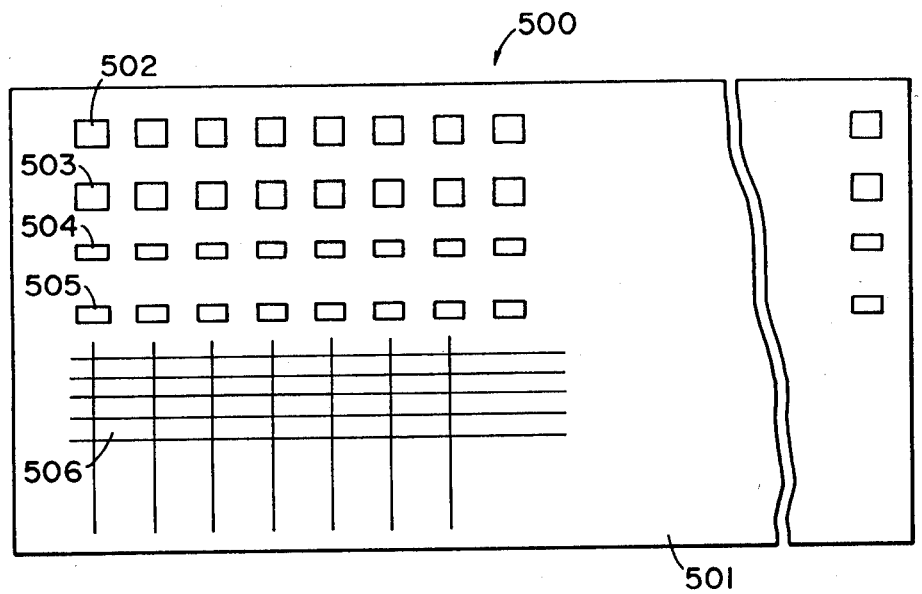
FIG. 5 is a schematic view showing the whole structure of the first embodiment.

The photoelectric converter, which is the first embodiment of this invention, comprises photoelectric converting elements 502, accumulating capacitors 503, film transistors 504 for transferring photoelectrically converted signals, transistors 505 forming a film transistor array and a matrix wiring section 506 all of which are arranged on an elongated substrate 501 of glass in the respective transverse arrays as shown in FIG. 5.

Figure 6:
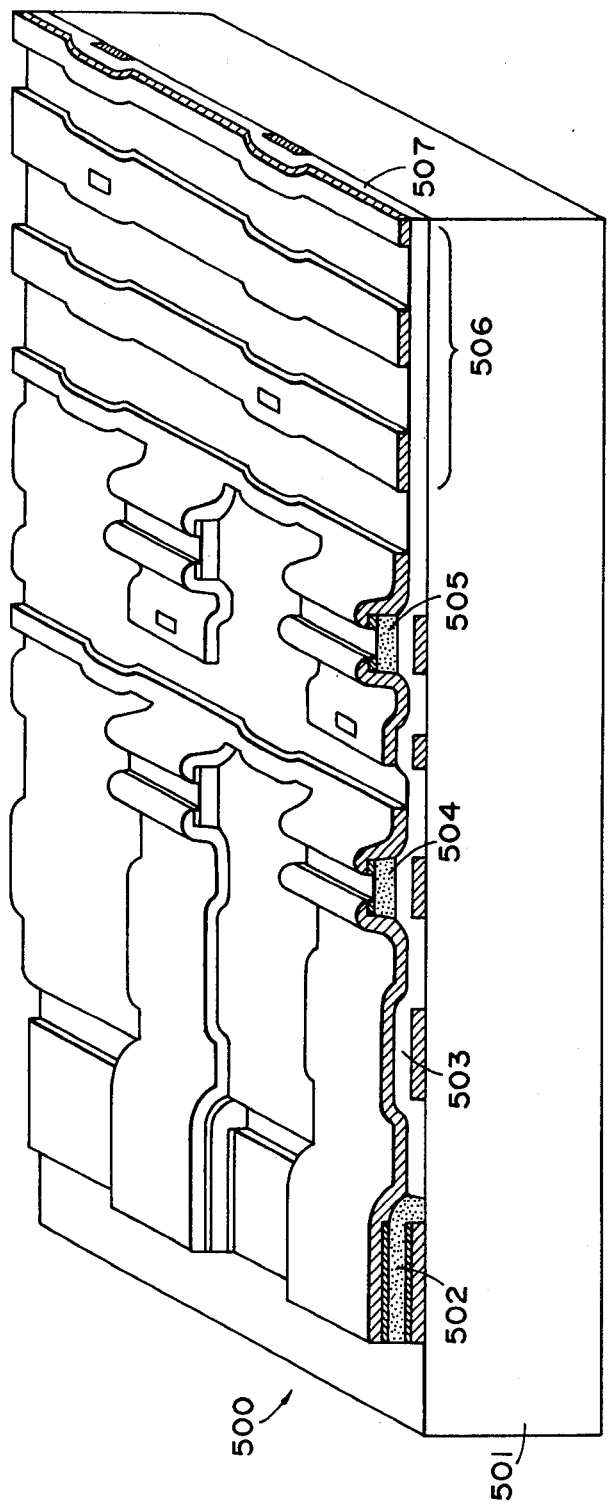
FIG. 6 is a perspective view schematically showing an example of the wiring pattern in the first embodiment.

FIG. 6 illustrates an example of the wiring pattern in the photoelectric converter 500 shown in FIG. 5. The photoelectric converter 500 comprises photoelectric converting elements 502, accumulating capacitors 503, transfer transistors 504 and film transistors 505 forming a film transistor array. Matrix wiring section 506 is connected with them through the insulating layer 507 in a double-layer wiring.

Figure 7:
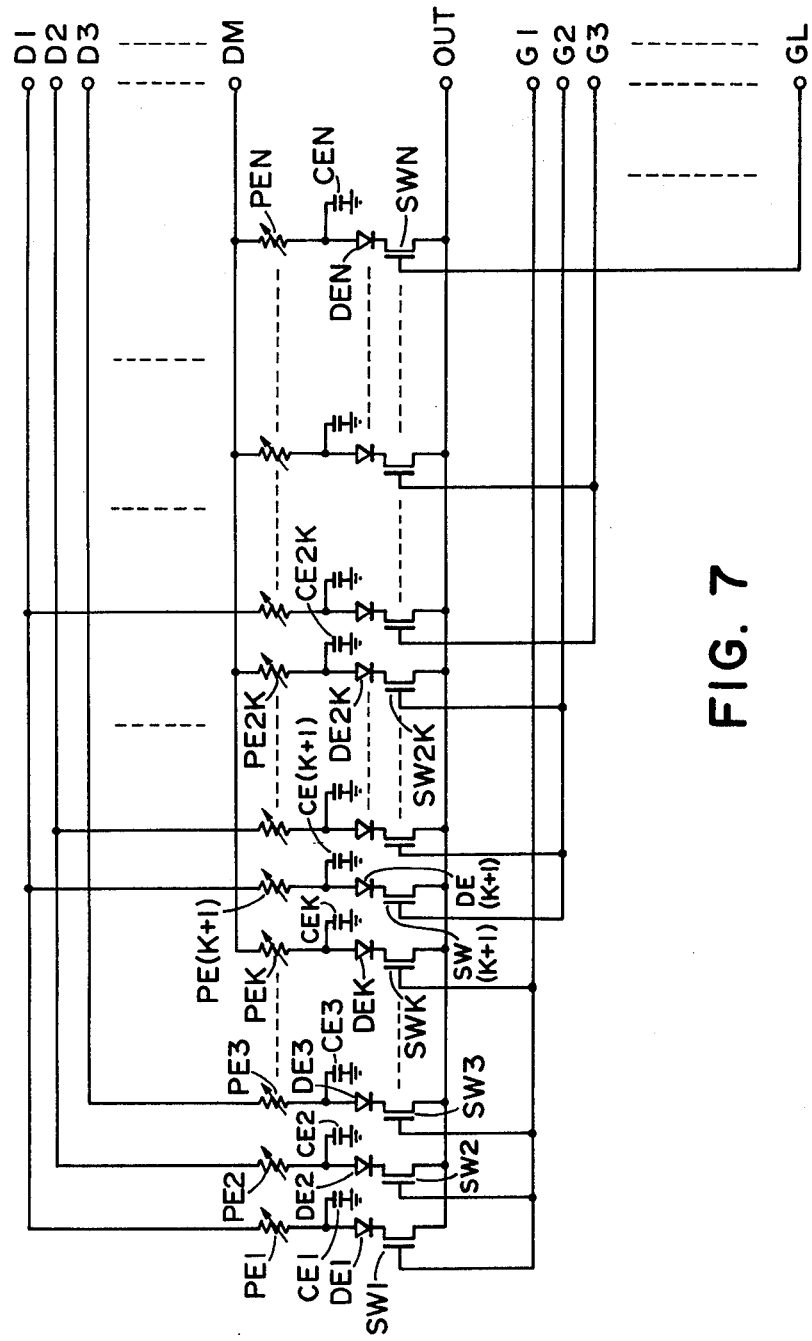
FIG. 7 is a diagram of an equivalent circuit used in a photoelectric converter which is the second embodiment of this invention.

FIG. 7 shows an equivalent circuit used in a photoelectric converter which is the second embodiment of this invention. This photoelectric converter comprises a photoelectric converting section constituted of photoelectric converting elements of N in number (PE1, PE2 . . . PEN), and a signal processing section constituted of capacitors of N in number (CE1, CE2, . . . CEN) each arranged correspondingly to each of the photoelectric converting elements PE for accumulating output signals from the photoelectric converting element, anti-crosstalk diodes of N in number (DE1, DE2, . . . DEN) and transfer transistors (SW1, SW2, . . . SWN) for successively transferring charges accumulated in the capacitors CE to an output terminal OUT.

Each of the photoelectric converting elements PE includes one electrode connected with the corresponding capacitor CE and the anode of the corresponding anti-crosstalk diode DE. The opposite poles of the accumulating capacitors CE are all earthed. The cathodes of the anti-crosstalk diodes DE are respectively connected with the drain electrodes of the respective transfer transistors SW.

The other electrodes of the photoelectric converting elements are connected with signal lines (D1, D2, . . . DM) in each M in number. These signal lines will be referred to as block selecting signal lines hereinafter.

The source electrodes of the transfer transistors SW are connected with the output terminal OUT. The gate electrodes of the same are connected with signal lines (G1, G2, . . . GL) in each L in number. These signal lines will be referred to as gate selecting signal lines.

Light-information incident on the photoelectric converting section is outputted from the output terminal OUT through the transfer transistors selected by gate selecting signals as outputs in the photoelectric converting elements which are driven by block selecting signals.

Figure 8:
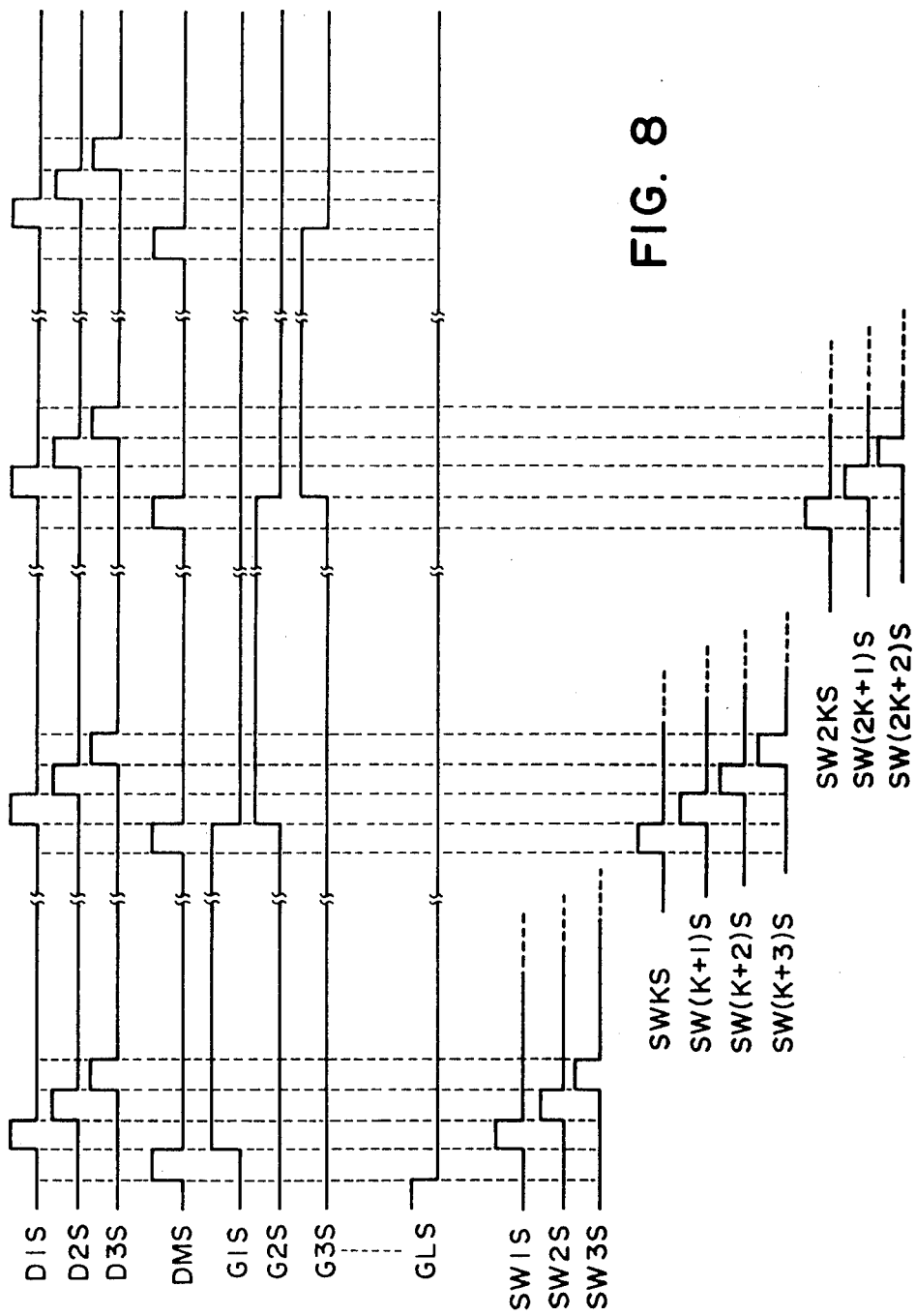
FIG. 8 is a timing chart for illustrating the operation of the second embodiment.

FIG. 8 shows a timing chart in driving the photoelectric converter which is the second embodiment of this invention shown in FIG. 7.

Drive frequency in the block selecting signals (D1S, D2S, . . . DMS) is generally M times as large as that in the gate selecting signals (G1S, G2S, . . . GLS).

The light information incident on the photoelectric converting section changes the resistance in the photoelectric converting elements to charge the accumulating capacitors CE by the clock of the block selecting signals (D1S, D2S, . . . DMS). The charges accumulated in the capacitors CE are successively outputted through the transfer transistors placed on their conductive states by the gate selecting signals (G1S, G2S, . . . GLS).

In this second embodiment, all of the photoelectric converting elements PE, transfer transistors SW and anti-crosstalk diodes DE are mounted on the same substrate through semiconductive films.

The photoelectric converting elements PE and transfer transistors SW are made of similar material to the first embodiment in the same structure. The substrate is also made of similar material to the first embodiment.

Figure 9:
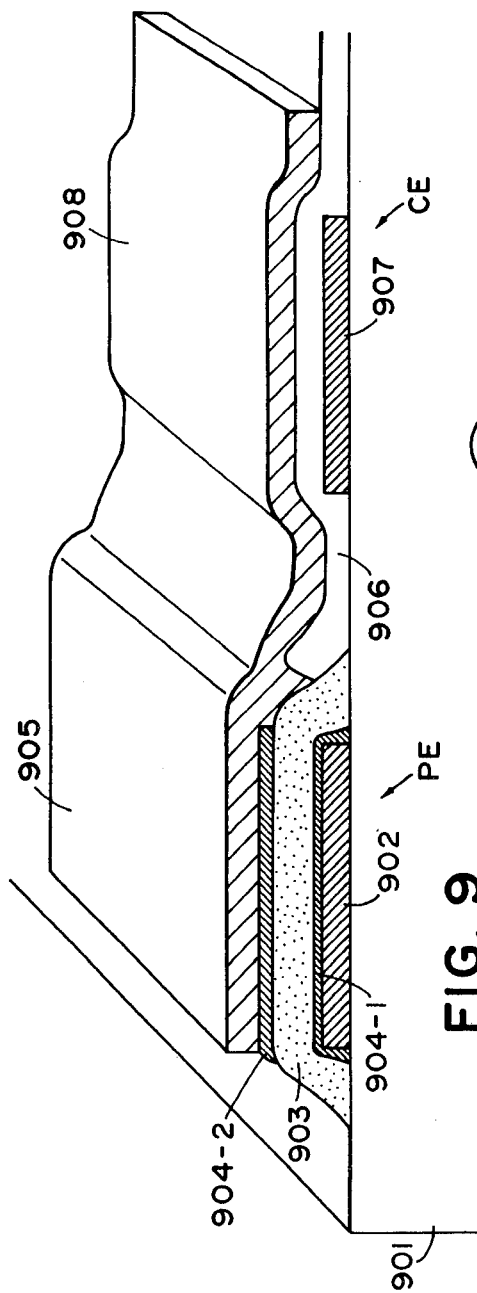
FIG. 9 is a perspective view schematically showing the structure of a photoelectric converting element in the second embodiment.

FIG. 9 illustrates the structure of the photoelectric converting element in the second embodiment. In this embodiment, the light-receiving surface of the photoelectric converting section is located on the opposite surface to the surface of the substrate 901 in which the photoelectric converting elements PE are disposed. Accordingly, electrodes 902 connected with a photoreceptor layer 903 are made of such a transparent material as $SnO_2$, ITO or the like.

Each of the photoelectric converting elements PE includes common and image-element electrodes 902 and 905 which are respectively formed on the opposite sides of the photoreceptor layer 903 through the respective n+ layers 904-1 and 904-2. These layers 903, 904-1 and 904-2 are made of similar material to the first embodiment.

The accumulating capacitors CE are also made of similar material to the first embodiment in the same structure. Namely, each of the capacitors CE comprises an insulating layer 906, an electrode 908 formed on the insulating layer 906 and electrically connected with the image-element electrode 905, and an electrode 907 formed opposed to the electrode 908 on the opposite side of the insulating layer 906.

Figure 10:
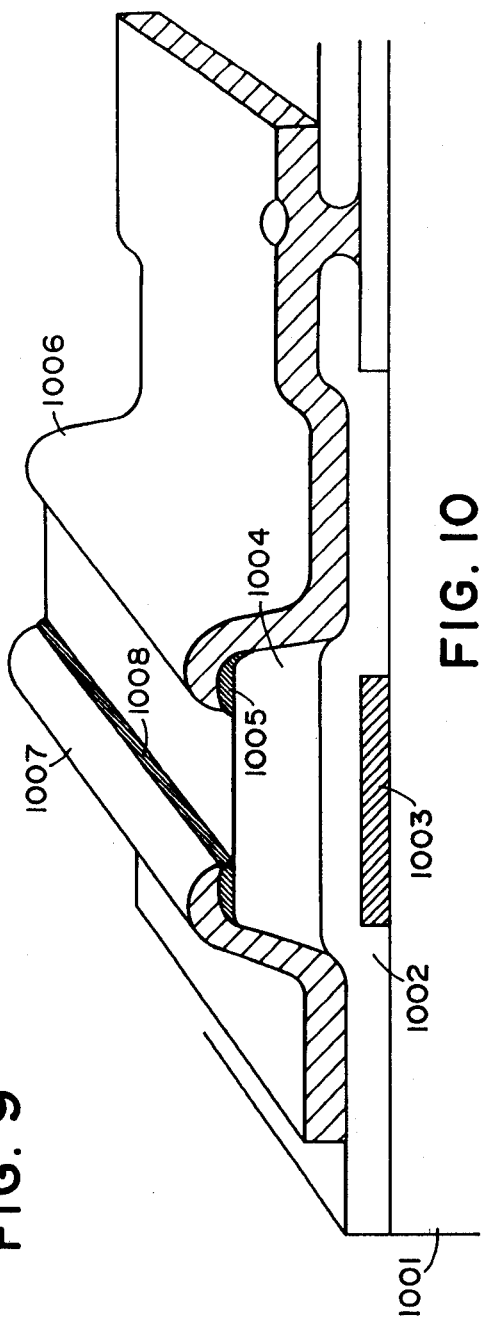
FIG. 10 is a perspective view schematically showing the structure of a film-like transistor in the second embodiment.

FIG. 10 shows the structures of the film transistor SW and diode DE in the second embodiment of this invention. This structure comprises a gate electrode 1003 on a substrate 1001, an insulating layer 1002 on the gate electrode 1003, a semiconductor layer 1004 formed of a-Si:H of non-dope, n or i type or polycrystalline silicon of i type on the insulating layer 1002, a n+ layer 1005 on the semiconductor layer 1004, and an source electrode on the n+ layer 1005. On the semiconductor layer 1004 there is also formed a Schottky junction forming layer 1008. Further, a drain electrode 1007 is formed on the layer 1008 for forming an anti-crosstalk diode DE. The Schottky junction forming layer 1008 can be made of such a material as Au, Ir, Pt, Rh, Pb or the like and is preferably made of Pt in this invention. The drain electrode 1007 is preferably made of Al.

Figure 11:
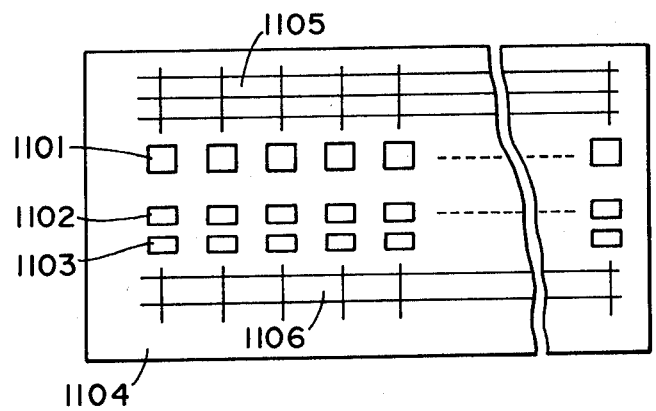
FIG. 11 is a schematic view showing the whole structure of the second embodiment.

As shown in FIG. 11, the photoelectric converter in the second embodiment comprises photoelectric converting elements 1101 of N in number, accumulating capacitors 1102 of N in number, film transistors 1103 of N in number structurally having anti-crosstalk diodes, wiring section 1105 for the photoelectric converting elements, and wiring section 1106 for the transistors.

Figure 12:
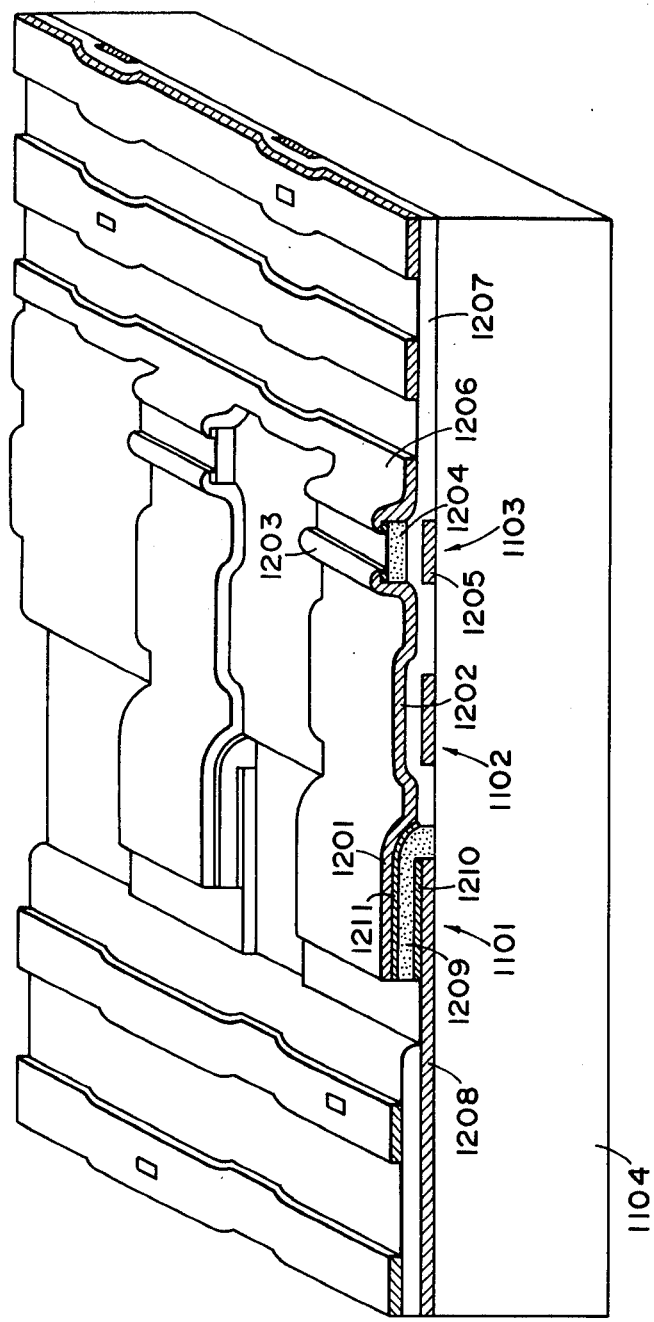
FIG. 12 is a perspective view schematically showing an example of the wiring pattern in the second embodiment.

FIG. 12 illustrates the structure of the second embodiment in which the photoelectric converting elements 1101, the upper electrodes 1201, the upper electrodes 1202 of the accumulating capacitors 1102 and the drain electrodes 1203 of the film transistors 1103 are integrally mounted on the substrate 1104. In this embodiment, an anti-crosstalk Schottky diode is formed by the drain electrode 1203 and the semiconductor film layer 1204. The gate and source electrodes 205, 1206 of the film transistor 1103 are electrically isolated from each other through the insulating layer 1207 and wired in a double-layer matrix.

The electrode 1208 on the light-receiving surface of the photoelectric converting element 1101 is formed of such a material as ITO or the like and electrically connected with the film transistor 1101 on an extension of the electrode 1201. In order to form ohmic junctions, n+ layers 1210 and 1211 are formed between the electrode 1208 and photoreceptor layer 1209 and between the electrode 1201 and photoreceptor layer 1209.

Figure 13:
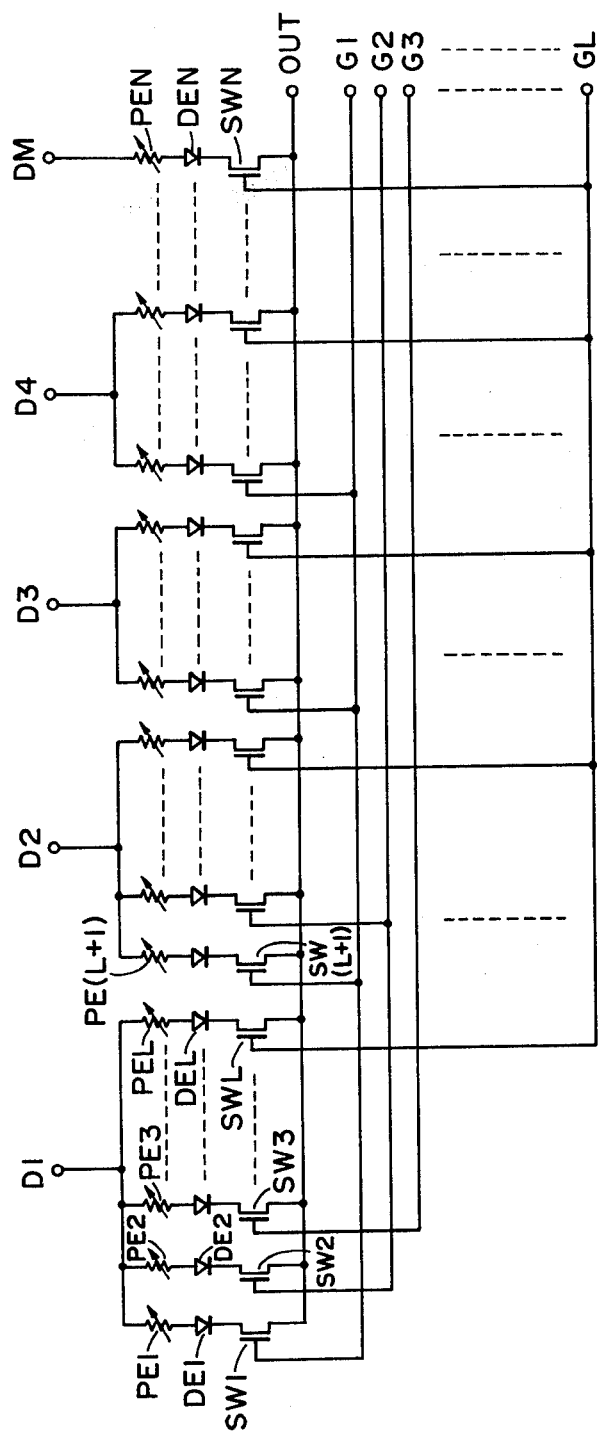
FIG. 13 is a diagram of an equivalent circuit used in a photoelectric converter which is the third embodiment of this invention.

FIG. 13 shows an equivalent circuit used in the third embodiment. This embodiment comprises a photoelectric converting section constituted of photoelectric converting elements of N in number (PE1, PE2, ... PEN) and a signal processing circuit section constituted of anti-crosstalk diodes of N in number (DE1, DE2, ... DEN) which are arranged one for each of the photoelectric converting elements and transfer transistors (SW1, SW2, ... SWN) for transferring output signals from the photoelectric converting elements PE to an output terminal OUT in time series.

The photoelectric converting elements (PE1, PE2, ... PEN) are divided into blocks of M in number, each of the blocks including the photoelectric converting elements of L in number. Each of the photoelectric converting elements PE includes one electrode connected with the corresponding common line D. The common line (D1, D2, ... DM) in each block will be referred to a block selecting signal line. The other electrode of the photoelectric converting element PE is connected with the anode of the corresponding anti-crosstalk diode DE. The cathode of the anti-crosstalk diode DE is connected with the drain electrode of the corresponding transfer transistor SW. All the source electrodes of the transfer transistors SW are connected with the output terminal OUT.

The gate electrodes of the transfer transistors SW are connected in each L in number with the signal lines (G1, G2, ... GL) which will be referred to as gate selecting signal lines.

Figure 14:
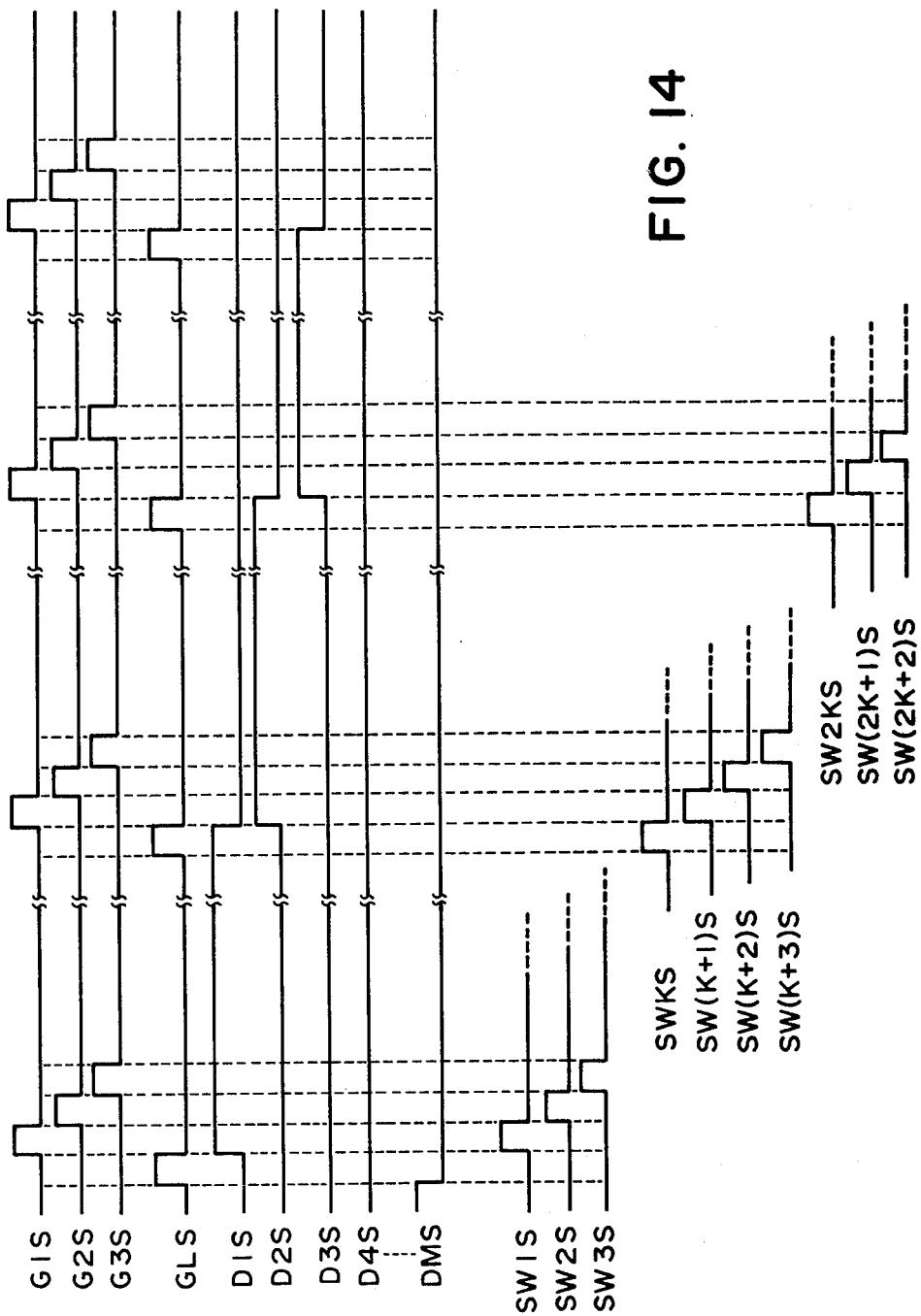
FIG. 14 is a timing chart for illustrating the operation of the third embodiment.

FIG. 14 shows a timing chart in driving the photoelectric converter shown in FIG. 13. Drive frequency in the gate selecting signals (G1S, G2S, ... GLS) is normally L times as large as that in the block selecting signals (D1S, D2S, ... DMS).

Light-information incident on the photoelectric converting section is outputted from the terminal OUT through the photoelectric converting element PE selected by the block selecting signal and the transfer transistor SW selected by the gate selecting signal. The block signals (D1S, D2S ... DMS) and gate signals (G1S, G2S, ... GLS) are successively selected to output signals from the photoelectric converting elements PE of N (=M×L) in number in time series.

In the third embodiment, the photoelectric converting elements PE, transfer transistors SW and anti-crosstalk diodes DE are mounted on the same substrate by semiconductor films in the same manner as in the first and second embodiments.

Figure 15:
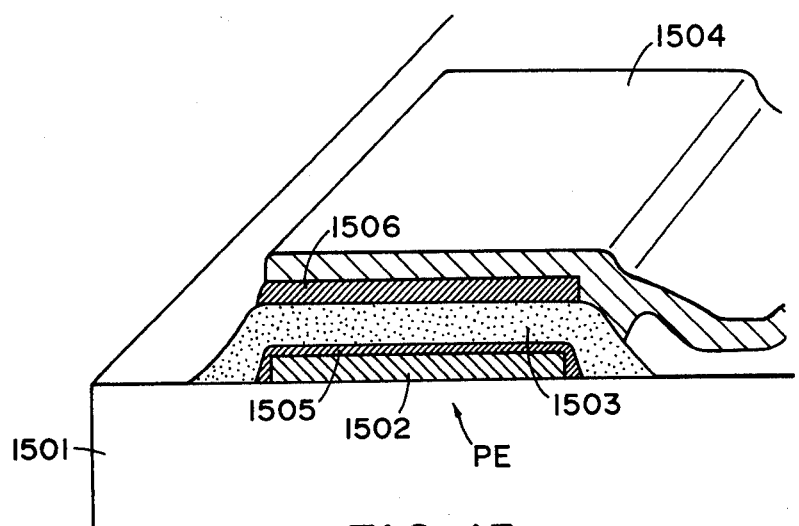
FIG. 15 is a perspective view schematically showing the structure of a photoelectric converting element in the third embodiment.

FIG. 15 shows the structure of a photoelectric converting element PE in the third embodiment. This photoelectric converting element PE has the same structure as the photoelectric converting elements shown in FIGS. 3 and 9 except that it has an internal structure including the anti-crosstalk diodes. The photoelectric converting element PE comprises a common electrode 1502 on a transparent substrate 1501, a photoreceptor layer 1503 and a n+ layer 1505 all of which are formed of the aforementioned material. An image-element electrode 1506 is made of such a material that is selected to form an anti-crosstalk Schottky diode between the electrode 1506 and the photoreceptor layer 1503. For example, if the photoreceptor layer 1503 is made of a-Si:H of non-dope, n or i type, the image-element electrode is formed of such a material as Au, Ir, Pt, Rh, Pd or the like. In this invention, the image-element electrode 1506 is preferably made of Pt.

On the top face of the image-element electrode 1506 there is formed a connection electrode 1504 for electrically connecting the image-element electrode 1506 with the drain electrode of the corresponding film transistor SW. The connection electrode 1504 is made of such a material as aluminum or the like.

The thickness in the photoreceptor layer 1503 is selected to permit no or negligible light to reach the anti-crosstalk diode and normally of 4,000 Å to 2μ, preferably 6,000Å to 1.5μ.

The film transistors SW in the third embodiment have the same structure and characteristic as those shown in FIG. 4 and will not be further described.

Figure 16:
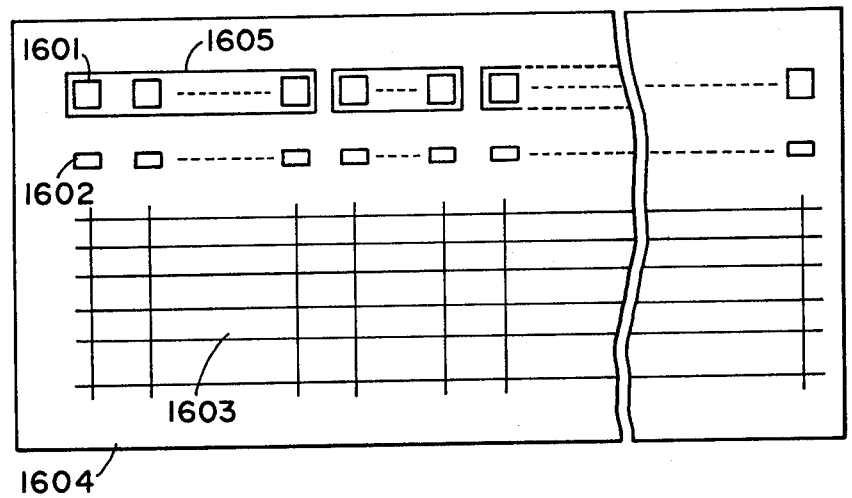
FIG. 16 is a schematic view showing the whole structure of the third embodiment.

As shown in FIG. 16, the photoelectric converting apparatus in the third embodiment comprises photoelectric converting elements 1601 of N in number including anti-crosstalk Schottky diodes therein, transfer transistors 1602 of N in number, and a matrix wiring section 1603 for the transfer transistors 1602 all of which are mounted on an elongated substrate 1604. The photoelectric converting elements of N in number, which are arranged in a transverse array, are divided into blocks of M in number in each of which the photoelectric converting elements 1601 are connected with a common electrode electrically.

Figure 17:
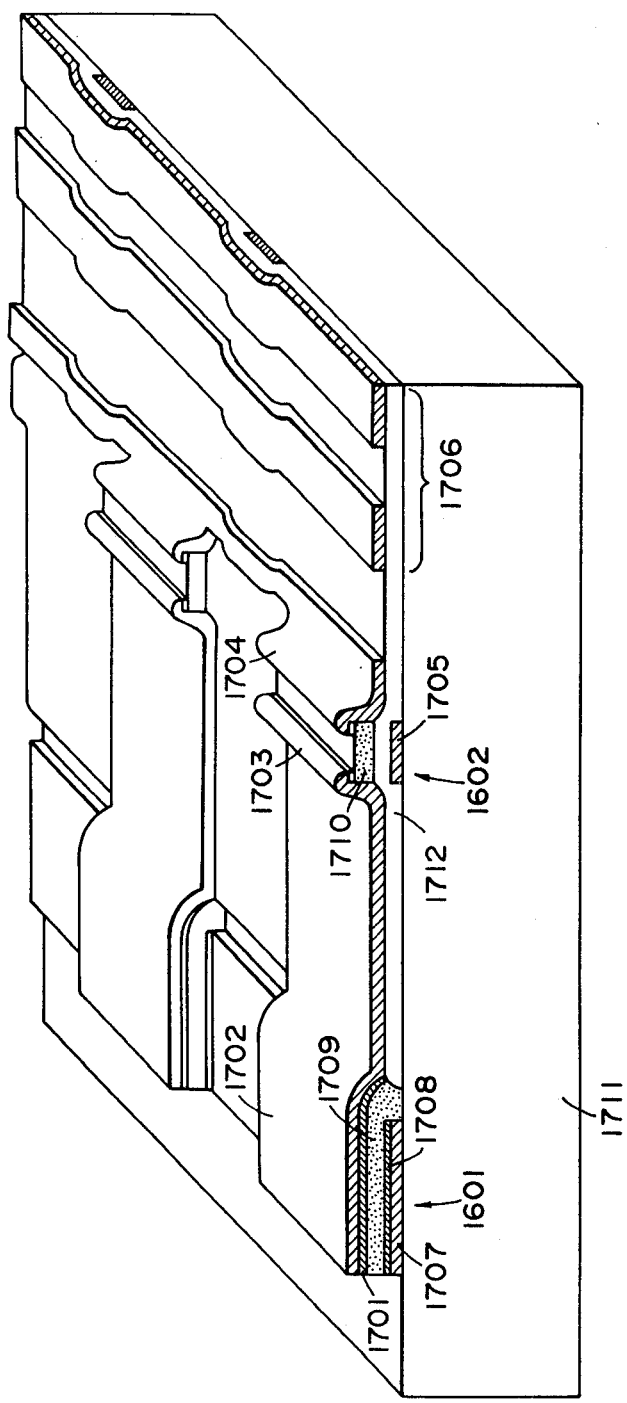
FIG. 17 is a perspective view schematically showing an example of the wiring pattern in the third embodiment.

FIG. 17 shows an example of the wiring pattern in the third embodiment. In such a wiring pattern, the upper electrodes 1701 of the photoelectric converting elements 1601 are connected with the drain electrodes 1703 of transfer transistors 1602 through the connection electrodes 1702. The transistors 1602 includes a common source electrode 1704 by which they are connected with one another. Gate electrodes 1705 are electrically connected with a matrix wiring section 1706 through insulating layers 1712 in a double-layer fashion. In FIG. 17, the common electrode 1707 of the photoelectric converting elements 1601, the n+ layers 1708, the photoreceptor layers 1709, semiconductor films defining the respective film transistors 1602 and the matrix wiring section 1706 are integrally mounted on a transparent substrate 1711.

Figure 18:
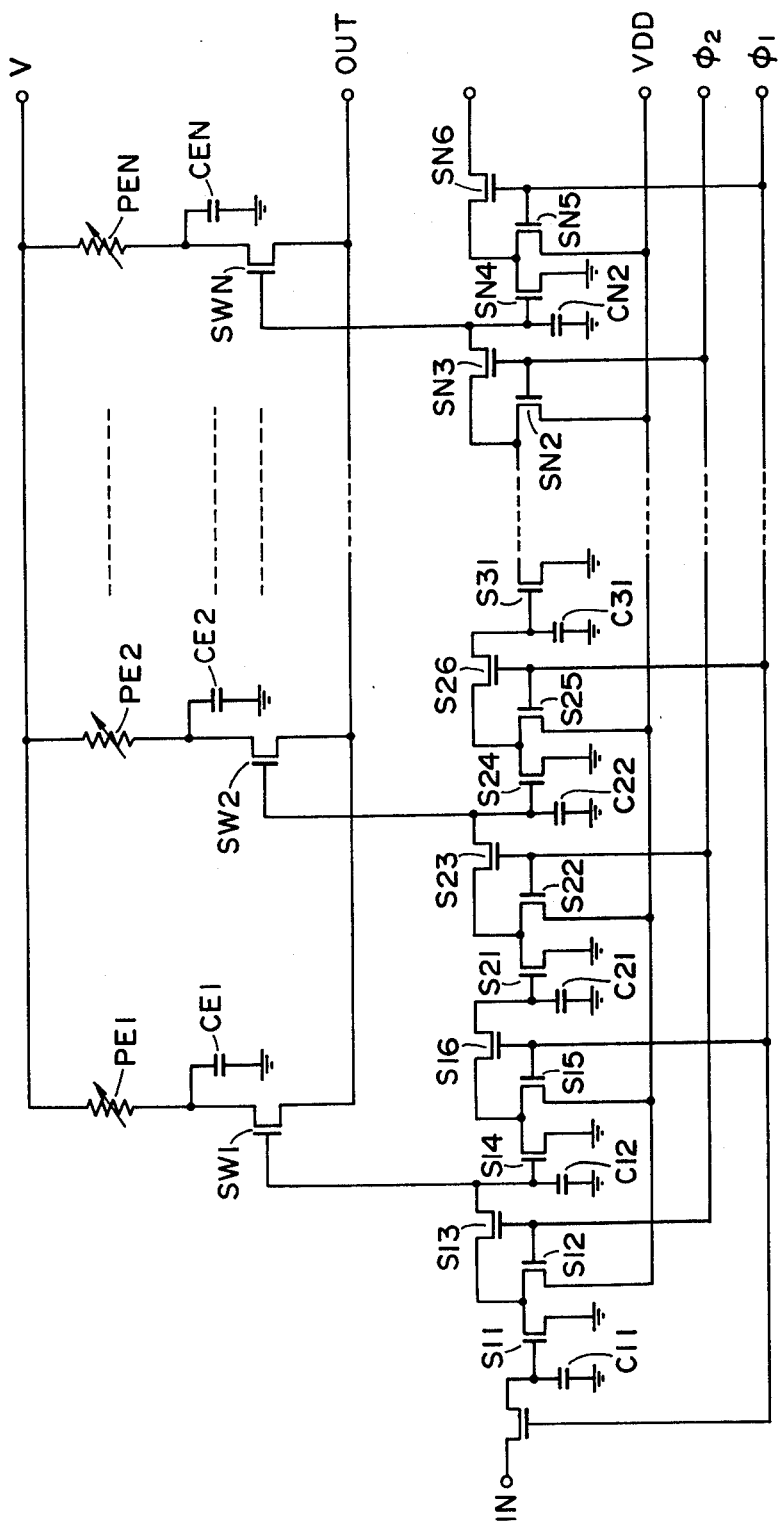
FIG. 18 is a diagram of an equivalent circuit used in a photoelectric converter which is the fourth embodiment of this invention.

FIG. 18 shows an equivalent circuit used in a photoelectric converter which is the fourth embodiment of this invention. This photoelectric converting apparatus comprises a photoelectric converting section constituted of photoelectric converting elements of N in number (PE1, PE2, . . . PEN) arranged in an array, and a signal processing section constituted of capacitors (CE1, CE2, . . . CEN) for accumulating output signals from the photoelectric converting elements PE, transistors (SW1, SW2, . . . SWN) for successively transferring the output signals from the photoelectric converting elements to the output terminal OUT, and shift registers (S11, . . . S16 . . . SN6) for successively switching the transfer transistors in a proper sequence.

Light-information incident upon the light-receiving surface modulates the resistance in the photoelectric converting elements PE to change the quantity of charge from the power source V for the photoelectric converting section to the accumulating capacitors CE. On the other hand, the charges accumulated in the capacitors CE are successively discharged through the output terminal OUT by placing the transfer transistors SW in their conductive states in sequence. In other words, the incident light-information is picked up from the output terminal OUT in time series as the quantity of charge accumulated in the capacitors CE during change in conductive state from one transfer transistor to another.

Each of the shift registers for driving the transistors SW includes six transistors (S11, S12, . . . S16) provided for one of the transfer transistors SW.

Figure 19:
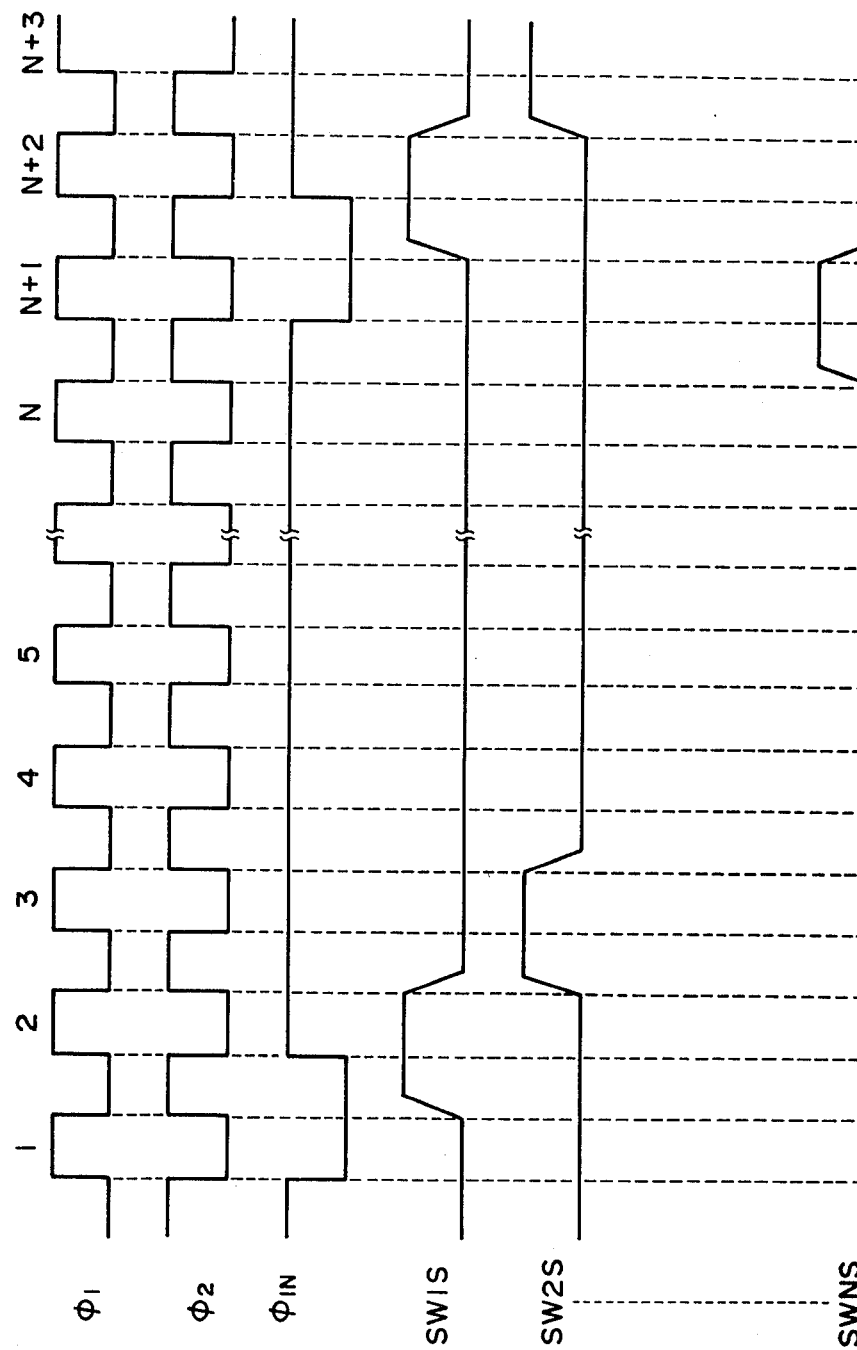
FIG. 19 is a timing chart for illustrating the operation of the fourth embodiment of this invention.

FIG. 19 shows a timing chart for the shift registers S and transfer transistors SW. Transferring clocks $\phi_1$ and $\phi_2$ are phases opposed to each other. After the clocks $\phi_1$ have been counted by N in number, a transfer pulse $\phi_{2N}$ is applied to a terminal IN. When the clocks $\phi_1$ are counted by each two, each of the transfer transistors SW are successively driven into its conductive state in the order of (SW1, SW2, . . . SWN).

The photoelectric converting element may suitably be a so called ohmic photosensor, constituted of a photoreceptor layer and electrodes which form ohmic junctions with said layer on both sides of said layer, and the transistor SW for transfer as well as the transistors S constituting the shift register are all formed of thin film transistors.

The photoreceptor layer constituting the photoelectric converting element PE is composed of a highly sensitive photoconductive material as mentioned above.

The semiconductor films constituting the thin film transistors SW and S are constituted of the amorphous or polycrystalline materials as mentioned above.

According to the present invention, the photoreceptor layer for the photoelectric converting element may suitably be formed of a-Si:H, while the film transistor SW or S of a-Si:H or polycrystalline silicon.

In the fourth embodiment, the layer thickness of the photoreceptor layer, which is to be determined depending on the degree of diffusion of photo-carriers generated by incidence of light-information, is generally from 4,000 Å to 2μ, preferably 6,000 Å to 1.5μ. On the other hand, the layer thickness of the semiconductor layer for the film transistors SW and S may desirably be thinner than the layer thickness of the void region generated by the voltage applied on the gate electrode provided through an intermediary insulating layer.

The photoelectric converting element PE and the accumulating capacitor CE in the fourth embodiment have structures as described with reference to FIG. 9 and their characteristics are also similar. Hence, there is made no description herein about these matters.

Figure 20:
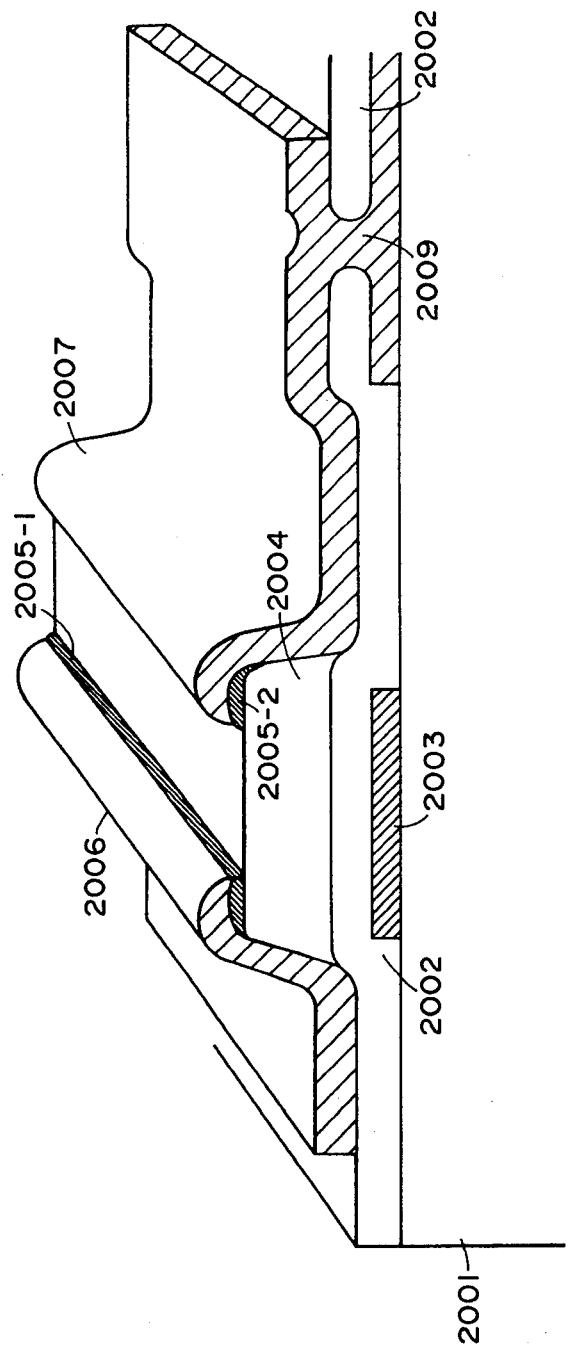
FIG. 20 is a perspective view schematically showing the structure of a film-like transistor in the fourth embodiment.

FIG. 20 shows the structure of a film transistor in the fourth embodiment. This structure comprises a substrate 2001, a gate electrode 2003 on the substrate 2001, an insulating layer 2002 on the gate electrode 2003, and a semiconductor layer 2004 on the insulating layer 2002. The film transistor also includes n+layers 2005-1 and 2005-2 on the semiconductor film layer 2004 on which source and drain electrodes 2006 and 2007 are disposed respectively.

The insulating layer 2002 can be made of $Si_3N_4$ by glow discharging, $SiO_2$ by sputtering or $SiO_2$ by CVD, and is preferably made of $Si_3N_4$ by glow discharging in this invention.

The gate electrode 2003 can be made of Al, Cr, Mo, molybdenum silicide, polycrystalline silicon film doped strongly into n or p type or the like. For example, if the semiconductor film layer 2004 is made of a-Si:H, the gate electrode 2003 is preferably formed of such a material as aluminum or the like. If the semiconductor film layer 2004 is made of polycrystalline silicon film, the gate electrode 2003 is preferably made of Mo or polycrystalline silicon doped into n or p type since the gate electrode must resist against temperatures above the film-fabrication temperature (400° C.) of the polycrystalline silicon film. The source and drain electrodes 2006 and, 2007 are preferably made of such a material as aluminum or the like.

The wiring between the film transistors and the electrical connection between the film transistors and photoelectric converting elements are effected by two wired layers which are separated electrically from each other by the insulating layer 2002. The doubled layers are connected with each other through a hole 2009 which is formed through the insulating layer 2002.

When it is wanted to form a shift register by film transistors, such transistors as shown by C11, C12, . . . CN2 in FIG. 18 are required to do so.

Figure 21:
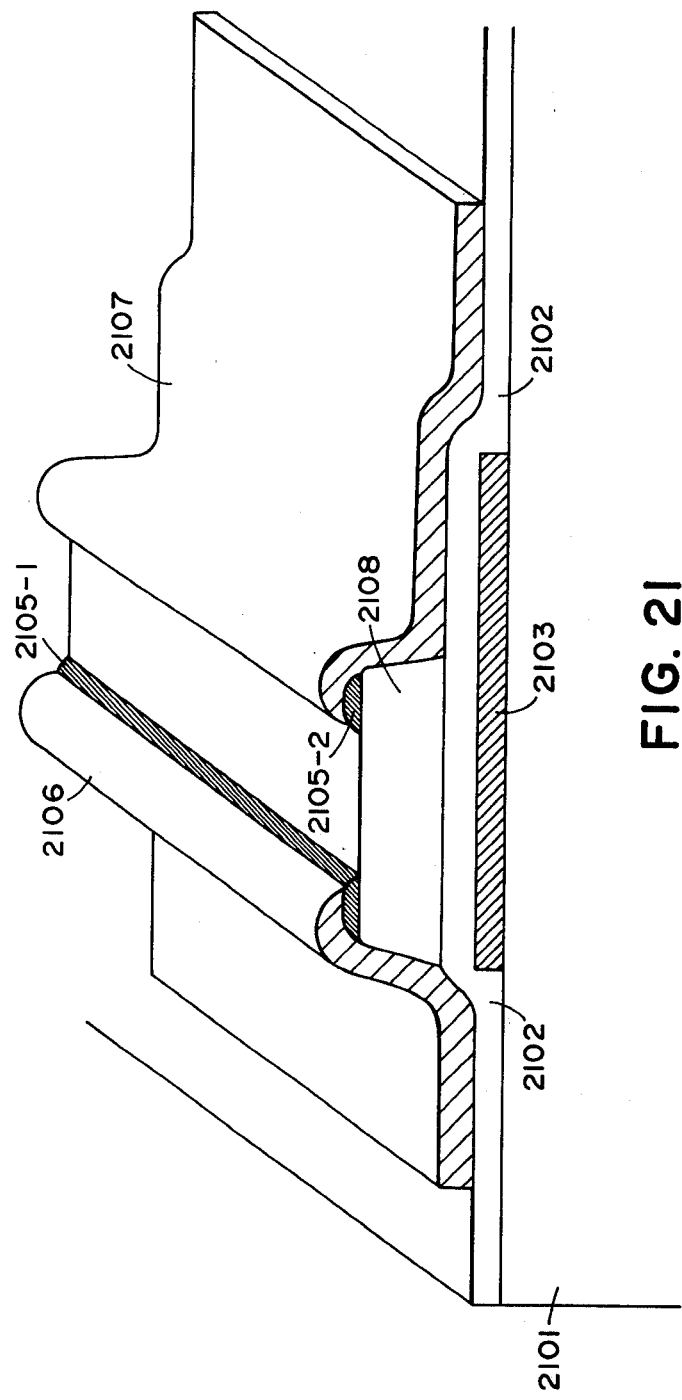
FIG. 21 is a perspective view schematically showing the structure of a film-like transistor in the fourth embodiment which includes a transferring capacitor.

FIG. 21 shows an example of the structure of a film transistor including the above capacitor therein. In this structure, a gate electrode 2103 on a substrate 2101 has a size larger than the conventional film transistor and is formed to provide a predetermined electrostatic capacity between the gate electrode 2103 and a source electrode 2107 through an insulating layer 2102.

On the insulating layer 2102 there is formed a semiconductor film layer 2108 on the opposite ends of which drain and source electrodes 2106, 2107 are respectively formed through n+layers 2105-1 and 2105-2 for forming ohmic junctions.

Figure 22:
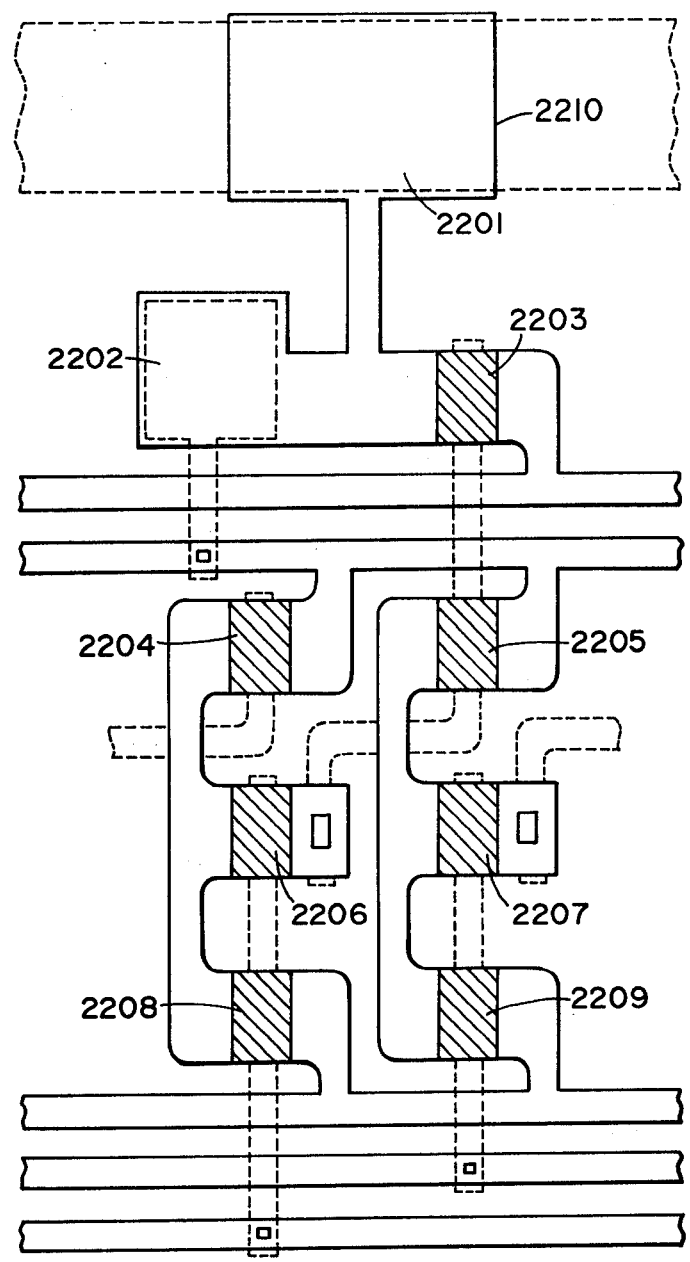
FIG. 22 is a schematic and fragmentary plan view showing an example of the wiring pattern in the fourth embodiment.

FIG. 22 shows an example of the wiring pattern in the fourth embodiment in which photoelectric converting elements 2201 are connected with accumulating capacitors 2202 and transfer transistors 2203 through their upper connection electrodes 2210. A shift register comprises transistors 2204, 2206, 2207, 2208 and 2209 and a transistor 2205 including a transfer capacitor. These six transistors are combined into a shift register unit. N in number of the shift register units are connected with one another in series into a shift register assembly.

What we claim is:

1. A photoelectric converter in solidstate assembly, comprising the following sections formed on the same non-semiconductive substrate:
   an elongated photoelectric converting section constituted of a number of photoelectric converting elements arranged in an array, each element having a light-receiving surface for input of light-information; and
   a signal processing circuit section comprising a corresponding number of accumulating means, each provided for a corresponding one of said photoelectric converting elements, for accumulation of signals produced as output from the corresponding photoelectric converting elements, a corresponding number of transfer means each for transferring the signals accumulated in the corresponding accumulating means, and an array of a corresponding number of transistors wired in a two-dimensional matrix to drive the corresponding number of transfer means in time series;
   wherein said photoelectric converting elements, and the transfer means and the transistors constituting said signal processing circuit section are constituted of thin semi-conductor films.

2. A photoelectric converter according to claim 1, wherein each photoelectric converting element comprises an electrode common to each photoelectric converting element, an independent electrode provided independently for each photoelectric converting element, and a photoreceptor layer disposed between these electrodes through a n+layer for forming an ohmic junction.

3. A photoelectric converter according to claim 2, wherein each independent electrode of the photoelectric converting element is connected in series to the electrode constituting each corresponding accumulating means.

4. A photoelectric converter according to claim 2, wherein each independent electrode of the photoelectric converting element is connected in series to the electrode constituting each corresponding transfer means.

5. A photoelectric converter according to claim 1, wherein the thin film semiconductor comprises amorphous hydrogenated silicon.

6. A photoelectric converter according to claim 1, wherein the thin film semiconductor comprises polycrystalline silicon.

7. A photoelectric converter in solid-state assembly, comprising the following sections formed on the same non-semiconductive substrate:
   an elongated photoelectric converting section constituted of a number of photoelectric converting elements arranged in an array, each element having a light-receiving surface for input of light-information; and
   a signal processing circuit section comprising a corresponding number of accumulating means, each provided for a corresponding one of said photoelectric converting elements, for accumulation of signals produced as output from the corresponding photoelectric converting elements, a corresponding number of diodes for prevention of crosstalk between the photoelectric converting elements, and a corresponding number of transfer means for transferring the signals accumulated in the corresponding accumulating means;
   wherein said photoelectric converting elements, said diodes and said transfer means are constituted of thin semi-conductor films.

8. A photoelectric converter according to claim 7, wherein each photoelectric converting element comprises an electrode common to each photoelectric converting element, an independent electrode provided independently for each photoelectric converting element, and a photoreceptor layer disposed between these electrodes through a n+layer for forming an ohmic junction.

9. A photoelectric converter according to claim 8, wherein each independent electrode of the photoelectric converting element is connected in series to the electrode constituting each corresponding accumulating means.

10. A photoelectric converter according to claim 8, wherein each independent electrode of the photoelectric converting element is connected in series to the electrode constituting each corresponding transfer means.

11. A photoelectric converter according to claim 7, wherein the thin film transistor comprises amorphous hydrogenated silicon.

12. A photoelectric converter according to claim 7, wherein the thin film semiconductor comprises polycrystalline silicon.

13. A photoelectric converter according to claim 7, wherein the transfer means is a transistor.

14. A photoelectric converter according to claim 13, wherein the transistor is internally provided by incorporation within its structure with a diode for prevention of crosstalk.

15. A photoelectric converter in solidstate assembly, comprising the following sections formed on the same non-semiconductive substrate:
   an elongated photoelectric converting section constituted of a number of photoelectric converting elements arranged in an array, each element having a light-receiving surface for input of light-information; and
   a signal processing circuit section comprising a corresponding number of diodes, each provided for one of said photoelectric converting elements directly connected thereto, for prevention of crosstalk between the photoelectric converting elements and a corresponding number of transistors, each being provided for one of said diodes directly connected thereto, for transferring the output signals from the corresponding photoelectric converting elements;
   wherein said photoelectric converting elements, said diodes and said transistors are constituted of thin semi-conductor films.

16. A photoelectric converter according to claim 15, wherein the photoelectric converting element is provided by incorporation within its structure with a diode for prevention of crosstalk.

17. A photoelectric converter in solid-state assembly, comprising the following sections formed on the same non-semiconductive substrate:
   an elongated photoelectic converting section constituted of a number of photoelectric converting elements arranged in an array, each element having a light-receiving surface for input of light-information; and
   a signal processing circuit section comprising a corresponding number of accumulating means, each provided for a corresponding one of said photoelectric converting element, for accumulation of signals produced as output from the corresponding photoelectric converting elements, a corresponding number of transfer means for transferring the signals accumulated in the corresponding accumulating means, and a corresponding number of shift registers, each to drive a corresponding one of said transfer means in time series;

wherein said photoelectric converting elements, and the transfer means and the shift registers constituting said signal processing circuit section are constituted of thin semi-conductor films.

18. A photoelectric converter according to claim 17, wherein each photoelectric converting element comprises an electrode common to each photoelectric converting element, an independent electrode provided independently for each photoelectric converting element, and a photoreceptor layer disposed between these electrodes through a n+ layer for forming an ohmic junction.

19. A photoelectric converter according to claim 18, wherein each independent electrode of the photoelectric converting element is connected in series to the electrode constituting each corresponding accumulating means.

20. A photoelectric converter according to claim 18, wherein each independent electrode of the photoelectric converting element is connected in series to the electrode constituting each corresponding transfer means.

21. A photoelectric converter according to claim 17, wherein the thin film transistor comprises amorphous hydrogenated silicon.

22. A photoelectric converter according to claim 17, wherein the thin film semiconductor comprises polycrystalline silicon.

* * * * *